United States Patent [19]

Lemelson

[11] 4,385,880
[45] May 31, 1983

[54] SHOCK WAVE PROCESSING APPARATUS

[76] Inventor: Jerome H. Lemelson, 85 Rector St., Metuchen, N.J. 08840

[21] Appl. No.: 74,388

[22] Filed: Sep. 10, 1979

Related U.S. Application Data

[63] Continuation-in-part of Ser. No. 958,514, Nov. 7, 1978, abandoned, which is a continuation-in-part of Ser. No. 93,779, Nov. 30, 1970, Pat. No. 4,207,154, which is a continuation of Ser. No. 668,561, Jun. 27, 1957, abandoned.

[51] Int. Cl.³ .......................... B29C 3/06; B29C 11/00
[52] U.S. Cl. ....................................... 425/77; 425/150; 425/182; 425/186; 425/261; 425/360; 425/361
[58] Field of Search ...................... 425/DIG. 5, 26, 77, 425/360, 136, 3, 78, 576, 150, 182, 184, 186, 261, 256, 361, 135, 150, 163, 182, 186, 256, 357, 360, 261; 51/307; 264/22

[56] References Cited

U.S. PATENT DOCUMENTS

| | | | |
|---|---|---|---|
| 2,217,336 | 10/1940 | Eden | 425/576 |
| 2,287,675 | 6/1942 | Fair et al. | 425/576 |
| 2,823,419 | 2/1958 | Winters et al. | 425/78 |
| 3,567,929 | 3/1971 | White | 425/78 |
| 3,574,892 | 4/1971 | Smith | 425/78 |
| 3,577,842 | 5/1971 | Nakai et al. | 425/3 |
| 3,632,242 | 1/1972 | Rasquin | 425/77 |
| 3,657,917 | 4/1972 | Chelminski | 425/77 |
| 3,677,673 | 7/1972 | Shapiro | 425/78 |
| 3,677,674 | 7/1972 | Bowles | 425/78 |
| 3,758,245 | 9/1973 | Hermes | 425/150 |

*Primary Examiner*—Willard E. Hoag

[57] ABSTRACT

An apparatus and method are provided for making diamonds. In one form, a plurality of shock waves are generated and are directed or focused against carbon particles retained in a cavity of a die such that the heat and pressure of the shock waves will heat and compress the particles of carbon to form one or more diamonds thereof. In another form, diamonds or particles of diamond dust are disposed in a cavity containing carbon particles and serve as substrates or nuclei on which carbon is converted to diamond forming larger diamonds thereof. Each of the diamonds disposed in the mold or die cavity is completely surrounded by carbon. A magnetic jack hammer of the type disclosed in U.S. Pat. No. 3,632,242 having a focusing horn attached thereto is employed to generate and transmit the trains of intermittent shock waves to the diamonds and carbon disposed in the mold. In another form, intense heat and pressure are generated by one or more laser beams which are directed at carbon particles per se or against diamond particles which are packed with carbon particles in a mold so as to form diamonds and/or increase the sizes of the diamonds disposed in the mold cavity with the carbon particles.

18 Claims, 7 Drawing Figures

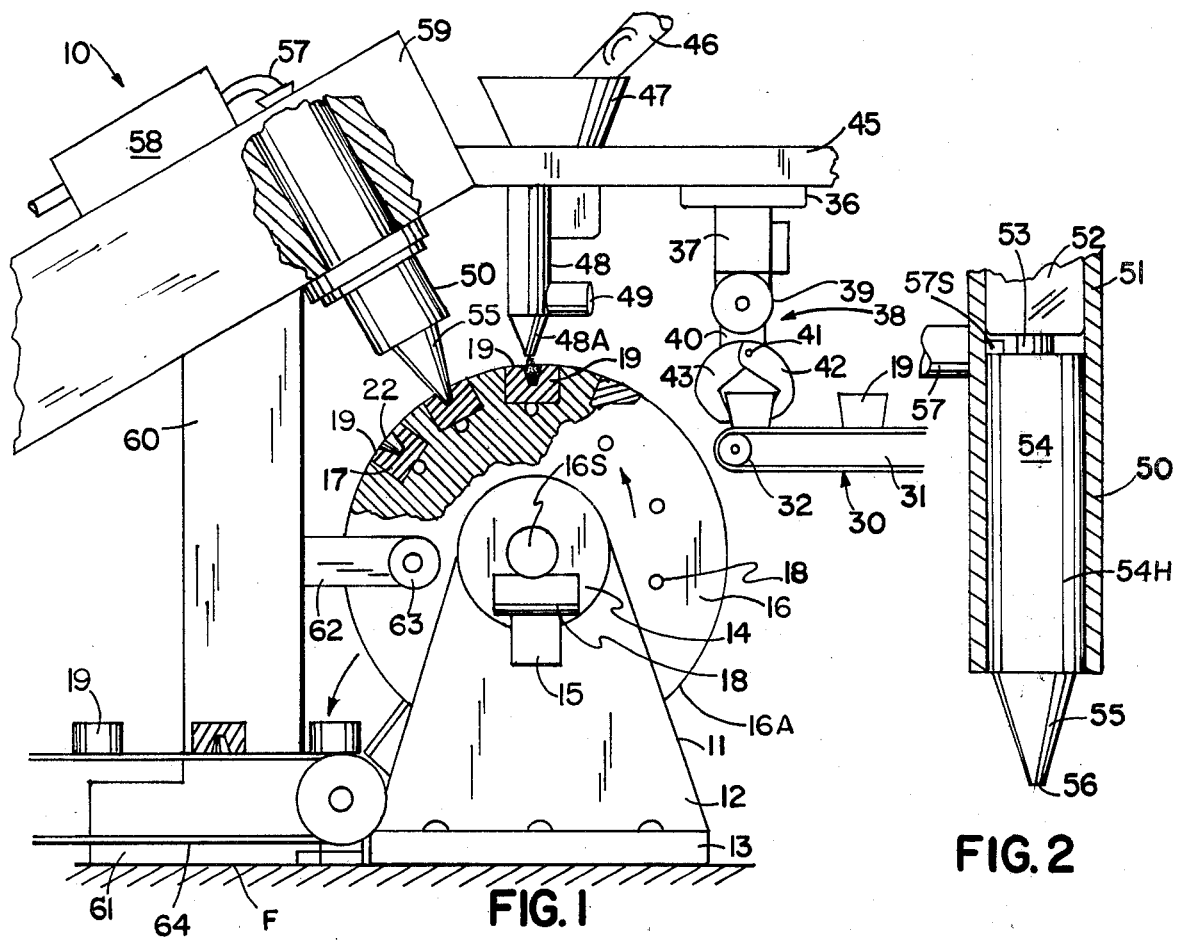
FIG. 1
FIG. 2
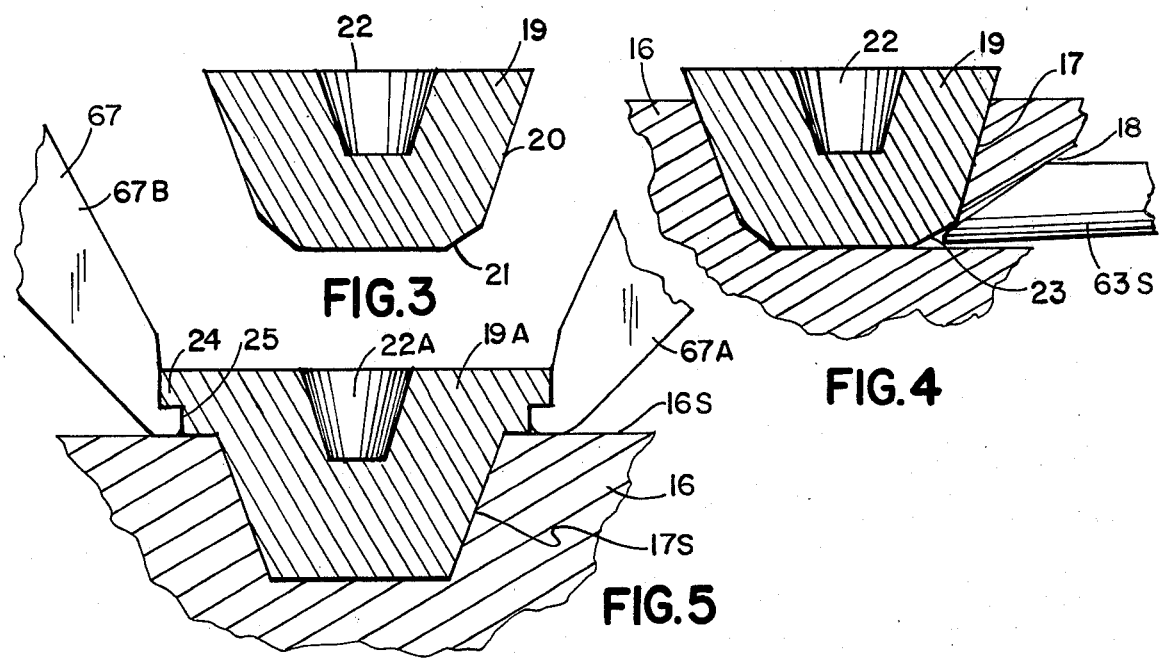
FIG. 3
FIG. 4
FIG. 5

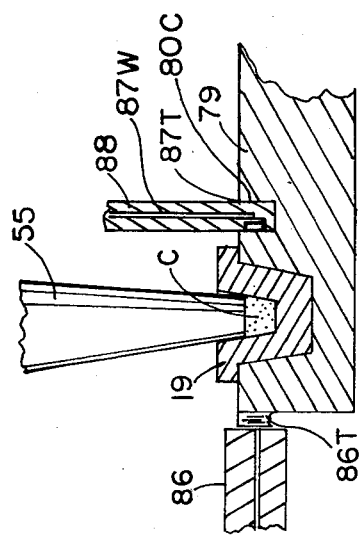
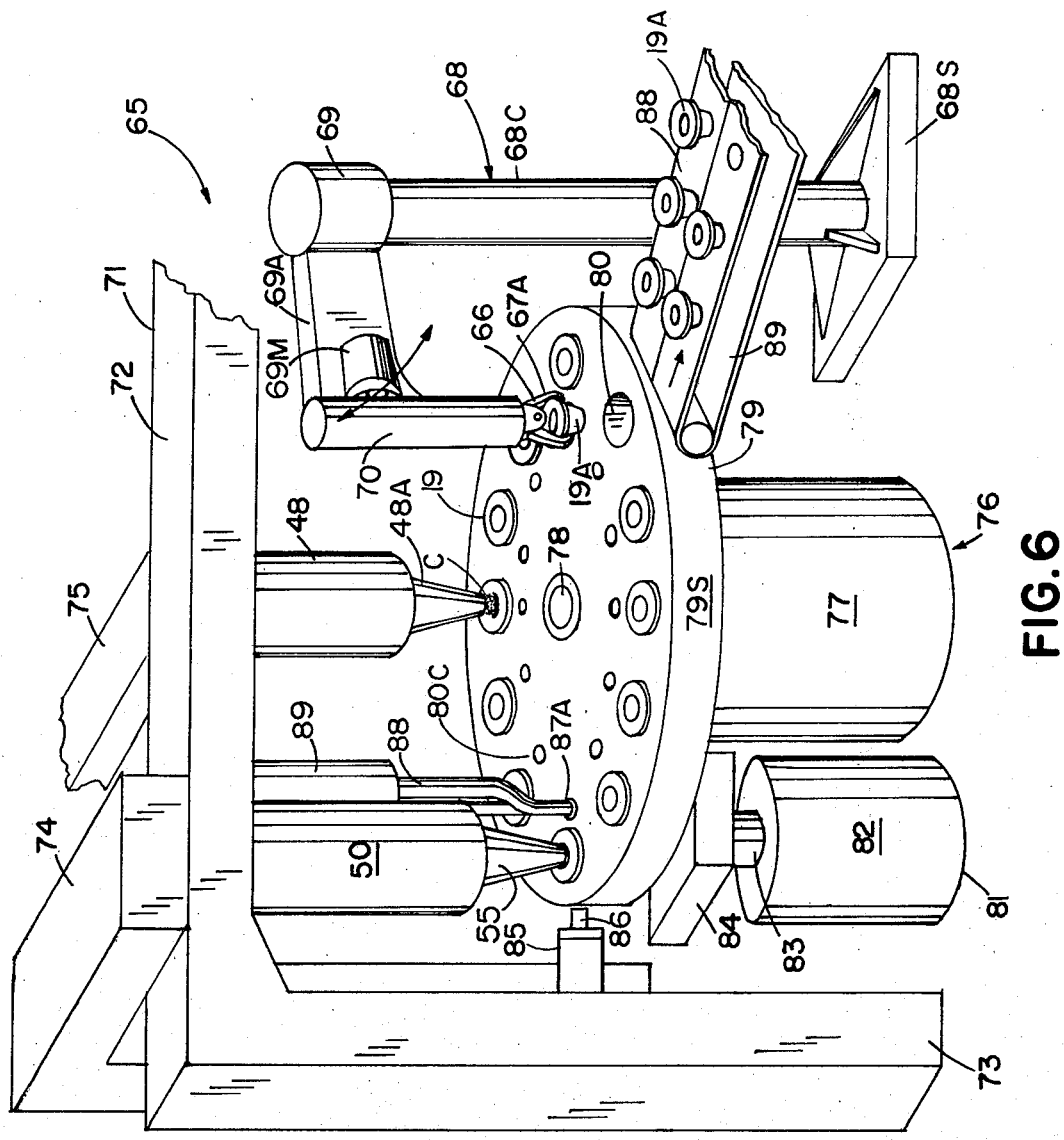

SHOCK WAVE PROCESSING APPARATUS

RELATED APPLICATIONS

This is a continuation-in-part of copending application Ser. No. 958,514 filed Nov. 7, 1978 and entitled Shock Wave Processing Apparatus and Method now abandoned which was a continuation-in-part of Ser. No. 93,779 filed Nov. 30, 1970 now U.S. Pat. No. 4,207,154 for Wave Generating Apparatus and Method, a continuation of application Ser. No. 668,561 filed June 27, 1957 now abandoned.

SUMMARY OF THE INVENTION

This invention relates to an apparatus and method for reacting on material by means of high intensity shock waves generated in and transmitted through solid transmission media. In particular, the invention is directed to a fully automatic manufacturing system and a method for subjecting solid material, preferably although not necessarily, in particulate form, to one or more intense shock waves which react on the material and effect either or both physical and chemical changes in the structure and composition thereof. In a particular form of the instant invention, the apparatus is capable of producing diamonds from carbon or graphite by subjecting a small quantity of powdered carbon or graphite, preferably while confined or restricted in the cavity of a mold or die, to one or more intense shock waves which react thereon to convert quantities thereof to diamond and to form diamond particles and bits.

It is known in the art to form diamonds from powdered carbon or graphite by subjecting a small quantity of such material to a single intense shock wave transmitted through a tapered solid shape, the end of which is engaged within a die cavity and compressing the particles of carbon. U.S. Pat. No. 3,632,242 describes such an apparatus which employs a so-called magnetic jack hammer to generate an intense shock wave and to direct same along a so-called horn wherein the shock wave reflects off the tapered walls of the horn and the reflections thereof reinforce each other and are transmitted from the end of the horn to the compacted carbon material. Experiments with such apparatus have indicated that a yield of less than one percent of the total carbon reacted on, is converted to diamond in the form of bits having a maximum diameter in the range of 0.1 millimeters. The apparatus defined in said patent, while relatively simple in construction, requires a substantial amount of labor to set up for each charge of carbon so treated and the labor required to disassemble or separate the female receptacle or die from the shock wave horn renders the process quite costly for the yield obtained.

The instant invention is directed to an apparatus employing intense shock waves for producing material such as diamond, new compounds of a plurality of material and new composites including abrasive tools and tool components, by subjecting one or more particulate materials and, in certain instances, preformed solid materials per se or in combination with particulate materials, to one or more intense shock waves in an apparatus which is either semi-automatic or fully automatic in its operation, thereby substantially reducing, if not eliminating, labor for the production of such materials.

In one form of the instant invention, a disc shaped carrying device, such as a turntable, is employed to hold or position a plurality of die, cavities or other tools in a circular array and to controllably and intermittently rotate to position such dies or cavities in alignment with respective material dispensing means located adjacent to the turntable for dispensing predetermined quantities of material or materials in each die or cavity, a shock wave directing means, such as a horn, and an unloading and die or cavity cleaning tool or tools for removing the material from each die or cavity after it has been operated on. A master controller or computer may be employed in an open loop, closed loop and/or adaptively controlled system to effect automatic control of the entire operation so as to assure suitable and predetermined production of diamonds or other material from the particulate material employed and reacted on by the shock waves. In another form of the invention, an elongated heavy metal plate or bar containing cavities at spaced apart locations for holding a plurality of dies, is intermittently fed past filling, shock wave transmission and emptying or unloading and cleaning means in a machine which operates to produce diamonds or other hard material at the processed material.

In a third form of the invention, individual dies are fed per se or on respective pallets along a transfer line adjacent which such devices as particulate fillings, ultrasonic generating and transmission emptying and die cleaning means are disposed which operate automatically to load, shock wave process, empty and clean the dies so processed. In another form, a drum is employed, the peripheral surface of which contains cavities therein in which cavities particulate material may be processed by means of shock waves in between index movements of the drum to bring each cavity into alignment with a shock wave generating and transmission means.

In yet another form of the instant invention, shock waves are generated and transmitted against an extrusion formed of particulate material while the extrusion is located in the extrusion die, and operate thereon to change the chemical and/or physical characteristics of the extrusion material.

Accordingly, it is a primary object of this invention to provide a new and improved apparatus and method for reacting on matter to improve its physical characteristics and, in certain instances, to change its physical and/or chemical composition.

Another object is to provide an automatic apparatus for reacting on solid particulate material by means of shock waves generated in and transmitted through solid media.

Another object is to provide an apparatus for automatically producing diamonds and other hard materials wherein manual labor and supervision or control is eliminated.

Another object is to provide an adaptively controlled apparatus and process for producing diamonds wherein the size and configuration of the diamond is monitored and the result of such monitoring, in the form of electrical signals, are applied to control the process.

Another object is to provide an apparatus for producing hard material, such as diamond, by subjecting a quantity of particulate carbon or graphite to a plurality of shock waves, generated and directed in sequence against the graphite.

Another object is to provide a process for producing diamond by progressively converting graphite to diamonds which increase in size as each of a plurality of shock waves are applied thereto.

Another object is to provide an apparatus and method for forming diamonds in situ on a hard substrate by means of shock waves applied to carbon or graphite particles disposed against such substrate in a confined space.

Another object is to provide an apparatus and method for reacting on particulate material with shock waves wherein the shock waves are each composed of a single shock wave or a plurality of shock waves amplified or reinforced by the controlled generation of a plurality of shock waves in a solid medium or separate media and their direction along a solid member in such a manner as to substantially increase the intensity of the shock wave or shock waves reacting on the material and the duration of the operative pulse of intense energy applied to the material.

Another object is to provide a method for amplifying shock waves generated in solid media.

Another object is to provide a method for enhancing the intensity of shock waves generated in solid media.

Another object is to provide a method for increasing the duration of pulses of shock wave force transmitted through a solid medium.

Another object is to provide a method for generating shock waves in a solid medium.

Another object is to provide an apparatus and method for forming composite materials by means of shock waves.

Another object is to provide means for improving the shock wave processing of matter.

Another object is to provide a new process and apparatus employing shock waves and an auxilliary means such as a laser for processing material with intense heat and pressure or force generated by shock waves.

With the above and such other objects in view as may hereafter more fully appear, the invention consists of the novel constructions, combinations and arrangements of parts as will be more fully described and illustrated in the accompanying drawings and the methods employed therewith, but it is to be understood that changes, variations and modifications may be resorted to which fall within the scope of the invention as claimed.

In the drawings:

FIG. 1 is a partial side view with parts broken away for clarity of a first form of the invention employing a rotating drum to position dies in alignment with shock wave generating means for processing material held in such dies;

FIG. 2 is a side view of a portion of the apparatus of FIG. 1;

FIG. 3 is a side view in cross section of one of the dies of the apparatus of FIG. 1;

FIG. 4 shows the die of FIG. 3 in place and a means for removing same from its support for cleaning and emptying.

FIG. 5 shows a modified die retaining and removal means in side cross section;

FIG. 6 shows a modified form of the invention wherein a rotary table supports the die and;

FIG. 7 is a section through one of the dies of FIG. 6.

Figure 8:
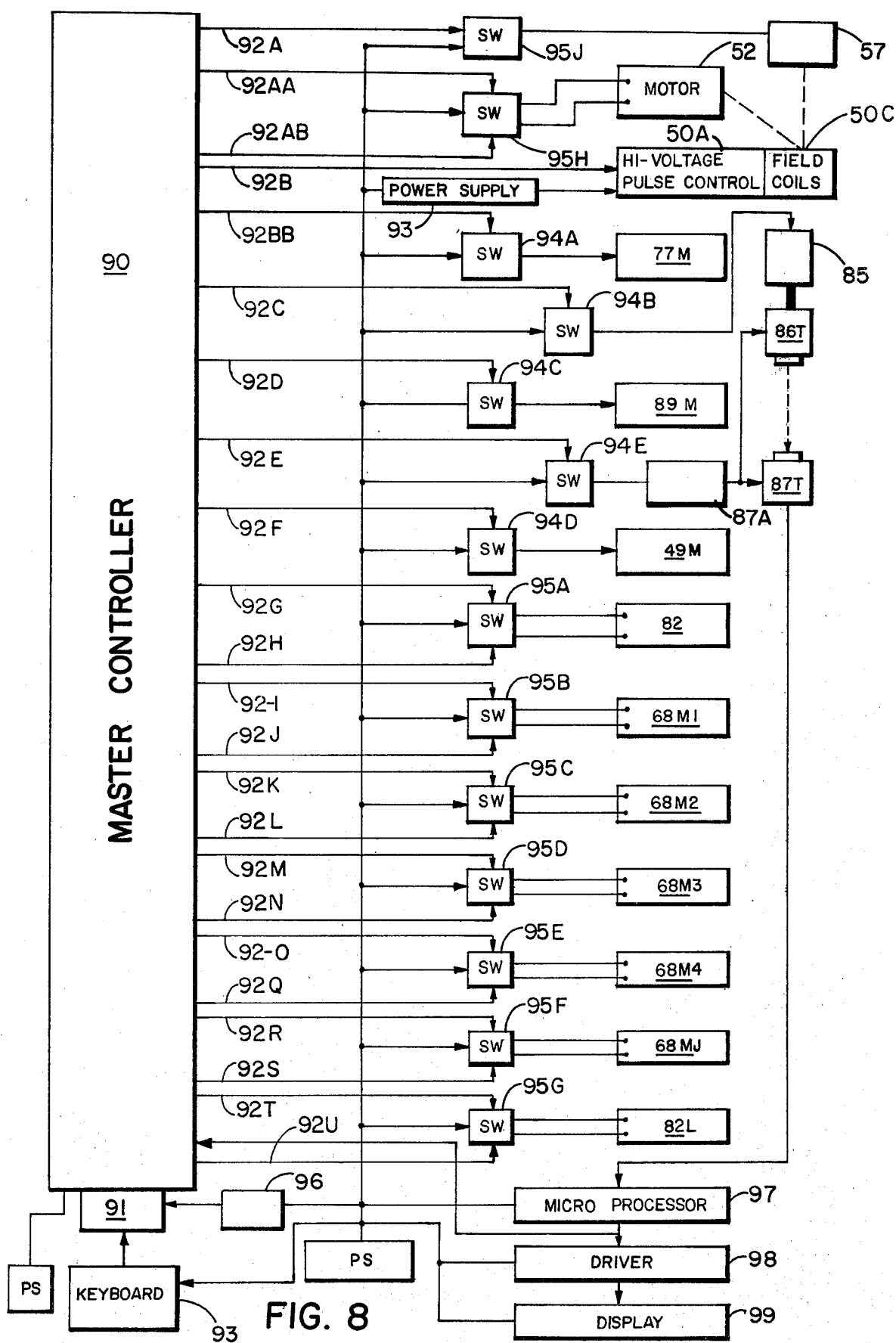

In FIG. 1 is shown an apparatus 10 for intermittently processing small quantities of matter, such as powdered carbon, with shock waves generated by a magnetic hammer of the type defined in U.S. Pat. No. 3,632,242 entitled "Apparatus For Making Diamonds". While the apparatus 10 may be utilized to produce diamonds from powdered carbon, it may also be applicable to produce other materials and shapes formed by compressing particles of such other materials in a die by means of a combination of an actuator and shock waves transmitted through a male die component to the particles.

The apparatus 10 includes a support 11 in the form of a pair of heavy tapered steel plates, one of which, 12, is shown supporting a bearing 14 which supports one end of a shaft 16S of a drum 16 adapted to rotate about a horizontal axis defined by shaft 16S by intermittently driving the latter by means of an intermittently operated electric motor 15 operatively connected to the shaft 16S through suitable gearing in a gear drive box 18.

Provided in the peripheral surface 16A of the drum 16 are a plurality of cavities 17, each of which contains a die block 19, two forms of which die block are illustrated in greater detail in FIGS. 3-5. The cavities 17 have side walls which taper inwardly toward the center of the drum 16 to permit the die blocks 19 to be easily seated in the cavities for operating on the particulate material disposed in the open cavities 22 of each die block. The heavy tapered plates or pillow blocks 12 are each supported by a respective base 13 which is bolted to the floor or foundation F of the building in which the apparatus 10 is housed.

Servicing the drum 16 by disposing die blocks 19 in the cavities 17 of the drum, filling such cavities, operating on the material in the cavities and removing the dies from the drum are functions which are automatically controlled by a master controller such as a digital computer which will be described. Such controller also controls means for feeding dies to and from the die carrying and support employed during processing, such as respective of a plurality of conveyors 30 and 64, and material handling and processing devices. A belt 31 of a first conveyor 30 is intermittently operated to bring each die block 19 of a plurality of such die blocks equispaced on its upper surface, into alignment with an article manipulator 38 which is supported by a lineal actuator 37 having its base 36 secured to an overhead frame 45 which is supported above the drum 16. The manipulator 38 includes a wrist assembly 39 which is movable vertically with respect to actuator 37 by being supported on the output shaft (not shown) of said actuator to pemit the jaws of an article handling device 41 to be moved downwardly on its support 40 by the controlled operation of the actuator 37, while the clamps or components 42 and 43 of the jaw are opened such that they may be automatically closed thereafter against the exterior surface of the die block to permit the jaw to peripherally engage the die blocks so that by controlled movement of the manipulator 38 and the pivoted wrist portion 40 supporting the jaw 41, the die blocks 19 on conveyor 30 may be automatically transferred from the conveyor to the next cavity 17 formed in the drum 16 which cavity comes into alignment with the end of the conveyor 30. Conveyor 30 is defined by endless belt 31 driven about two or more drums, one 32 of which is shown in FIG. 1, by means of a power operated device such as a motor. Such motor may be automatically controlled to intermittently drive the die blocks 19 to the end of conveyor 30 and dispose them in direct alignment with the manipulator 38 so that the latter may pick up and insert the small ends of each die block in cavities or receptacles provided in the drum 16 which is intermittently driven thereafter in a counterclockwise direction to bring the next empty cavity 17 into alignment with the manipulator 38 and the next die block into alignment with a filling device 48 for particulate material which automatically dispenses a predetermined quantity of such particulate material, such as powdered carbon, through a nozzle end portion 48A thereof by means of an automatically operated motor driven valve or injector 49 supported by the head 48.

At the next position of the drum 16, the tip 56 of a tapered focusing horn 55 is inserted into the cavity 22 of the die block and serves to compact the particulate material therein, after which the magnetic jack hammer 50 is operated to generate one or more shock waves therein and apply such shock waves to the particulate material placed in the cavity 22 by means of the loading device 48. The intense shock waves generated and passed through tapered shock wave converging horn 55 is concentrated at the end 56 thereof and in being passed to the powdered carbon in the cavity 22 of the die block, serves to form small industrial diamonds of the carbon material disposed in the die block into which the horn 55 is inserted and operated.

Each time the heavy metal drum 16 is intermittently driven, a respective die block 19 of the plurality of die blocks which are disposed in the cavities 17 of the drawing 16, is brought into alignment with the filling nozzle 48A for particulate material to be operated on in the die block cavity 22 and the end of the horn 55 of the magnetic hammer 54. The magnetic hammer 54 is supported for sliding movement within a heavy walled cylindrical housing 50 and is secured to the heavy output shaft 53 of a motor or solenoid 52 which is secured to the side wall 51 of the housing 50. The magnetic hammer 54 may thus be advanced and retracted with respect to housing 50 to advance the end of the horn 55 into the cavity 22 of the die block 19 aligned therewith and to retract it so as to clear the tip 56 of the horn 55 from the cavity in the die block top permit the drum 16 to be rotated thereafter to bring the next die block into alignment with the end of the horn 55. A suitable motor operated locking mechanism may be supported by the housing 50 to secure and hold shaft 53 in the advanced position during the generation of a shock wave or other suitable shaft locking means may be employed.

The housing 50 is supported by a heavy metal pillar 59 which is supported at the upper end of a vertical frame 60, the lower end 16 of which is secured to the foundation or floor F of the buildng in which the equipment is disposed. The motor or device 52 may also contain a locking mechanism for releasably supporting the shaft 53 when in its advanced position so as to compress and retain the magnetic hammer 54 in an extended position with the tapered end 55 of the tapered shock wave converging horn or shock wave coupling device 55 compressively engaged against the inside surface of the wall of the cavity 22 of the die block aligned therewith even during the interval the intense shock wave is transmitted through the horn 55 to the particulate carbon material disposed in the cavity 22. A special actuator or motor may be supported within the housing 52 defining the lineal actuator or motor which advance and retracts shaft 53 so as to properly retain the shaft 53 in an advanced position during the interval the shock wave is generated in and passed through the hammer 54 to the end 55 thereon. The heavy overhead structure 60 which includes columns 59 and 60 is of sufficient strength and designed to absorb the tremendous pressure and shock waves transmitted thereto from the magnetic hammer 54 when the latter operates. Notation 58 refers to a bank of electric capacitors and suitable control means for generating and controlling the application of one or more pulses of intense electrical energy through a cable 57 extending to the coil or coils of the magnetic hammer 54 located in housing 50. Such electro-magnet may be a super conducting magnet of sufficient field strength to generate shock waves in the magnetic hammer 54 of sufficient intensity such that when they are focused or directed along the tapered end or horn 55 of the hammer, they will suitably react on the particulate material disposed in the cavity 22 of the die aligned therewith to effect a desired reaction, such as the conversion of carbon to diamond particles.

The overhead frame 45 which supports the manipulator 38 and the supporting elements 36 and 37 thereof, also supports a hopper supply means 47 and an inlet conveyor 46 for providing suitable particulate material to the dispensing apparatus 48 and nozzle 48A supported above the drum 16.

While the individual dies 19, which are intermittently fed along the conveyor belt 31 of conveyor 30, are secured within the cavities 17 of the drum 16 by means of the manipulator 38 disposing such die blocks in the cavities from above the drum, removal of the die blocks from the drum cavities after the particulate material in the cavities has been operated on and partially converted to diamond, is a requisite if it is desired to remove the compressed particulate material from the cavities 22 of each die block, unless such operation is effected by means of special tooling disposed adjacent the drum 16 and containing means, such as powered brushes or tools, for entering the die block cavities and mechanically removing the processed material therefrom. In FIG. 1, each die block is individually removed from its cavity 17 and placed on the belt of an outgoing conveyor 64, by means of a special tool 63 suppoted on a bracket 62 which is secured to the vertical column 60. The tool 63 may comprise a push-pull actuator, such as an air or hydraulic cylinder, having an output shaft 63S which is automatically inserted into an opening 18, when aligned therewith, which opening extends to the cavity 17 containing the die block aligned with the tool 63, as shown in FIG. 4. The shaft 63S of the tool 63 is shaped at its end and operable to engage the tapered lower end 23 of the die block in the cavity 17 and, preferably by impact therewith, force the die block out of the cavity in the drum 16 so that it falls thereafter onto the conveyor belt 64. The tapered side wall 20 of the die block shown in FIG. 3 has a lower portion 21 which is specially shaped to be engaged by the tapered end of the shaft 63S of the tool 63.

The die blocks may also be removed from the drum 16 for removal of the contents of their cavities by a manipulator of conventional design, which includes jaw elements 67A and 67B as illustrated in FIG. 5. In this embodiment, the die 19A is shaped with an upper side wall portion having a flange 24 and an inwardly stepped portion 25 below the flange permitting the ends of the jaws 67A and 67B to be engaged under the flange above the outer surface 16S of the drum 16 and to remove the die block from the cavity 17S of the drum by a pulling action. The manipulator 67 may be automatically operated thereafter to transfer the removed die block from the drum 16 to a conveyor or a machine which is operable to remove processed material from the cavity 22A of the die block.

Suitable automatic means is provided for disposing emptied and cleaned die blocks 19 on the belt 31 of the conveyor 30 and removing die blocks disposed on the belt of conveyor 64 to an apparatus for removing the processed material from the cavities of the die blocks.

The die blocks 19, drum 16 and other components of the equipment subject to high stress and shock forces during the passage of shockwaves therethrough may be made of suitable high strength impact resistent material such as maraging steel or other metal alloy. Such components may also be reinforced with steel wire wound thereon to resist destruction resulting from the high forces and stress caused by the shock waves and their reflections.

In FIGS. 6 and 7 is shown a modified form of the invention wherein the horizontally rotating drum 16 of the apparatus in FIG. 1 is replaced by a heavy disc shaped table 79 which is intermittently driven on a support 77 about a vertical axis to bring different die blocks 19, which are seated within cavities 80 extending downwardly from the upper surface of the table 79, into alignment with respective devices for placing such die blocks in the cavities 80, disposing suitable particulate material C within the die blocks, compacting the particulate material in the die blocks and passing one or more shock waves therethrough to process the material and removing die blocks from the table. The apparatus 65 of FIG. 6 is serviced by a pair of intermittently operated belt conveyors denoted 88 and 89, both of which are serviced by a single manipulator 68. Belt conveyor 88 is intermittently driven by a motor (not shown) and preposition respective die blocks 19A disposed thereon at a loading station (not shown) in alignment with manipulator 65 so that the manipulator may be automatically operated to pick up a die block 19A after it has removed the die block from a cavity 80 aligned with the conveyor and placed it on outgoing conveyor 89. The latter is intermittently driven to advance the die blocks disposed thereon by the manipulator 68 away from the table 79 to an unloading and cleaning station or machine which operates to remove processed materials from the cavity of each die block presented to it.

The manipulator 68 is supported by a column 68C which is supported on the base 68S and includes a motor operated assembly 69 at its upper end which pivots about the vertical axis of the column 68C moving a laterally extending arm 69A in pivotal movement above the table 79 to dispose the manipulator arm 70 in alignment with each cavity 80 as it comes into alignment with the loading and unloading station such that the manipulator arm 70 may be driven by lineal motor 69M on arm 69A to position the jaw elements of the manipulator head 66 to permit them to engage the peripheral rim of the die block supported by the table and permit operation of the manipulator to pull the die block out of the cavity 80 and place it on the outgoing conveyor 89, after which the manipulator may be brought into alignment with a die block 19A which is properly disposed on the incoming conveyor 88 by the controlled intermittent driving movement of the conveyor and thereafter pick up and transport the die block to the empty cavity 80.

Also illustrated in FIG. 6 is a bucking block 84 which is supported on the shaft 83 of a heavy lineal actuator 82 and is locked beneath the table 79 after it has been advanced upwardly against the underside of the table in the vicinity of the work station aligned with the tapered horn 55 of the magnetic hammer 51. The shaft 83 of the actuator 82 is either locked in an up position during the generation of shock waves applied to the die or is fixedly mounted to absorb shock waves applied thereto through the table and die by means of the magnetic hammer.

Notation 71 refers to a heavy inverted U-frame supporting the particulate material loading fixture 48 and the magnetic hammer housing 50 as well as the elements thereof illustrated in FIG. 2. Auxiliary frames or supports 74 and 75 connect to the overhead beam 72 of the frame 71 to reinforce same and absorb the intense force generated by operating the magnetic hammer in housing 50.

Supported by the vertical column 73 of frame 71 is a housing 85 containing a transducer 86 which either continuously engages the peripheral surface 79S of the table 79 or is intermittently driven into and out of engagement therewith each time the table is stopped. A transducer 86 supported by housing 85 is then intermittently or continuously operated to transmit radiation through the material of the table 79, the die block 19 aligned therewith at the work station and to a receiving transducer 87T which is disposed within a cavity 80C formed in the upper surface of the table 79. The wave energy which may comprise ultrasonic energy generated by transducer 85T or X or Gamma radiation generated by a suitable source thereof located in housing 85, is passed through the material C disposed in the cavity of the die block and is modulated in accordance with variations of such material which may be effected by the shock wave or waves transmitted thereto through the tapered end 55 of the magnetic hammer. The transducer 87T which is supported at the end of an arm 88 converts the received radiation to electrical signals which are transmitted to a computer containing analyzing electrical circuit means for automatically analyzing the signals so generated and determining the nature of the transformation or conversion of material C within the cavity of the die block being subjected to shock waves. Such electrical signals may be employed in an adaptive control system to adaptively control the input energy and/or number of shock waves generated and passed to the particulate material C disposed within the die block for automatically controlling the processing operation.

The housing 88 which contains the transducer 87T at the end thereof is an elongated extension of the shaft of a lineal actuator 89 which is supported by the horizontal overhead column 72 and which is automatically operated to advance the end of housing 88 into the cavity 80C aligned with the cavity 80 containing the die block which is engaged by the magnetic hammer. When the magnetic processing operation has been completed, actuator 89 operates to retract its arm 88 and cause the end thereof to clear the upper surface of table 79 so that the table may be rotated thereafter to bring the next die block into alignment with the end of the magnetic hammer and the next cavity 80C into alignment with an end of the shaft 88 containing the transducer 87T. Wires 87W connect the transducer 87T to receiving and analyzing circuits for the signals output from the transducer and extend through the passageway in the center of arm 88 to such circuits.

It is noted that all of the hereinbefore described operations controlling the incoming conveyor for die blocks, removing individual die blocks from the end of the conveyor and transporting them by manipulator to respective empty cavities in the drum or turntable, intermittently rotating the drum or turntable thereafter, disposing measured amounts of particulate material in the open die block cavities, compacting such particulate material in the cavities by advancing either the operating end of the magnetic hammer or an auxiliary device into the die block opening aligned therewith; advancing, operating and retracting the magnetic hammer with respect to the die block; advancing and removing tool for removing each die block aligned therewith from its cavity and operating cavity container inspection means as described, may be automatically controlled by a master control device such as a computer, microprocessor or other suitable device operable to generate suitable control signals on a plurality of outputs thereof extending to various controls for the motors and solenoids operating the described equipment. Such controller or computer may also be operated to close and open switches for controlling the charging of the capacitor storage bank employed to operate the magnetic hammer and may also be utilized to control the operation of die block cavity emptying and cleaning devices disposed adjacent the described equipment.

It is also noted that the rotational supports for the shafts of the drum of the apparatus 10 of FIG. 1 or the turntable and apparatus of FIG. 6 as well as the other devices associated therewith which are subject to the intense forces of the shock waves applied to the die blocks, may be suitably reinforced by shock absorbing reindorcing means either during the operation of the magnetic hammer or at all times, to prevent damage thereto and malfunction of the apparatus described.

In FIG. 8 is shown a control diagram illustrating a control system for automatically controlling an apparatus, such as the type illustrated in FIGS. 6 and 7, it being noted that similar means may be applied to the apparatus of FIGS. 1 and 2 or to modified forms of the invention as described herein. While the system illustrated in FIG. 8 is generally an open loop control system, it is noted that suitable feedback control means may be employed to control the operation of one or more of the motors employed to operate the manipulator, the means for power rotating the turntable, the means for driving the shock wave focusing horn into the openings in the die and the means for controlling operation of the motors driving the conveyors 88 and 89. For example, if the dies 19A are equi-spaced on the conveyor belt of the feedin conveyor 88 then open loop control means may be employed to intermittently drive the belt of the conveyor to bring the endmost die on the belt to a receiving location at which the manipulator jaws 67A and 67B may be prepositioned and operated to pick up each endmost die to load same in the respective cavity 80 to the turntable 79S without the need for detecting the presence and location of the dies on the belt of conveyor 88.

The control system in FIG. 8 includes a master controller 90 which receives operating and output electrical energy from a power supply PS and generates command control signals thereafter on a plurality of outputs 92 in sequence for controlling the various switches and motors. The output signals, which may comprise electrical signals of predetermined time durations or pulses generated at predetermined time intervals after the master control becomes initiated in its operation, are employed to effect energization and deenergization of various switches controlling such operating components as the field coils 50C of the shock wave generating device 50, the ultrasonic energy transducers 86T and 87T and other devices associated with the apparatus 65 of FIGS. 6 and 7 which will be described. The master controller 90 may vary from an electromechanical multi-circuit timer to an electronic integrated circuit microprocessor capable of operating either in an open loop mode whereby signals are generated on the outputs 92 thereof in timed sequence or at predetermined time intervals to a generator of command control signals in response to feedback signals generated by limit switches, tachometers, variable potentiometers and the like, synchros or other devices which are operated by the motors being controlled to provide feedback signals to the master controller 90 to control one or more of the motors in a closed loop control mode. An output 92B of the master controller 90 extends to the control input of a control circuit 50A which includes means for applying a high voltage electrical pulse to the field coils 50C of the shock wave generating device 50 as supplied by a high voltage power supply 93 which may comprise a capacitance relay bank similar to 58 of FIG. 1. When a pulse or signal is applied on output 92B, a switch in the control 50A is energized, thereby applying a high voltage pulse to the field coils 50C causing an intense shock wave to be generated and transmitted to the working head or focusing horn 55 along which it travels toward the reduced diameter end thereof and into the particulate material C disposed in the cavity of the die aligned therewith so as to effect an intense reaction such as the conversion of carbon to diamond particles.

Output 92A of master controller 90 extends to the switch closing input of a normally open switch 95J which gates, when closed by a signal generated on output 92A, electrical energy from the power supply PS to the solenoid or motor 57 advancing its shaft to lock the shock wave generating device 54 in an advanced position with the end portion 56 of the horn 55 compressing particles in the cavity of the die aligned therewith, an operation which is effected just prior to the generation of the operating shock wave by energizing the input 92B to the high voltage pulse control 50A.

A bistable or flip-flop switch 95H is connected to the power supply PS for controlling the operation of motor or actuator 52 to advance and retract the shock wave generating head 54 toward and away from the die aligned therewith. Such switch is controlled in its operation by signals generated on respective outputs 92AA and 92AB of the master controller 90 to effect forward and reverse movement of the apparatus 54 connected to the shaft of motor 52 to cause the end 56 of the horn 55 to tamp and compress particles of carbon or other material disposed in the cavity of the die aligned therewith both prior to and during the shock wave generating operation as described.

A normally open switch 94A connects the power supply PS to the energizing input of the motor 77M which drives the turntable support for the dies in a counterclockwise direction. Switch 94A is closed when a signal is generated on output 92BB of master controller 90 and causes the motor 77M to step per se or to step drive the turntable 79S through an intermittent drive mechanism, such as a rachet and pawl.

A normally open switch 94B is caused to close when a signal is generated on the output 92C of controller 90 and thereby supplies electrical energy to operate both the solenoid or motor 85 driving the ultrasonic transducer 86T into engagement with the peripheral surface of the turntable 79S during or after the shock wave treatment operation. Another normally open switch 94C is closed when electrical energy is applied on another output 92D of the master controller 90 and supplies electrical energy to operate a monostable solenoid 89M which drives the arm 88 containing the receiving transducer 87T at its end to dispose such transducer in the cavity 80C radially inwardly of the cavity containing the die in which material is being processed, as illustrated in FIG. 7.

A normally open switch 94E is closed when a signal is generated on an output 92E of the master controller 90 and provides electrical energy from the power supply PS to an electronic ultrasonic energy generator 87A, the output of which is connected to the ultrasonic transducer 86T for energizing same.

Another normally open, monostable switch 94D is closed when a signal is generated on an output 92F of the master controller 90 and supplies electrical energy for operating motor or solenoid 49M for causing a predetermined quantity of particulate material to be dispensed in the open cavity of the die aligned with the dispensing head 48A of dispenser 48.

Bistable switches 95A–95F are employed to control the forward and reverse operation of the motors 68M1, 68M2, 68M3, 68M3 and 68J which operate the automatic manipulator 68 in at least the two modes of removing a die from a cavity 80 of the turntable and placing it on the conveyor belt of conveyor 89 and removing a die from the belt of conveyor 88 and placing it in the empty cavity of the turntable. Such motors, although not illustrated in detail in FIGS. 6 and 7, conventionally cause the manipulator arm assembly to pivot or rotate back and forth on the vertical column 68C, move radially with respect to the lateral arm 69A, move up and down with respect to the turntable 79S and the conveyors 88 and 89 and open and close the jaws or handling device comprising the operating head of the manipulator. Four or more of such motors are required to define the article manipulator 68, further reference to a typical manipulator being made to U.S. Pat. Re.26,904 entitled Article Manipulation Apparatus, particularly such an apparatus is illustrated in FIG. 2 which provides for at least four degrees of movement of the operating head in addition to its operation. Each of the switches 95A–95F are controlled by respective pairs of outputs of the master controller 90 denoted 92G–92S.

Another bistable switch 95G is controlled by respective outputs 92T and 92U of the master controller 90 and supplies electrical energy for the forward and reverse controls of a motor or bistable solenoid 82L, which is not shown in FIG. 6, but is employed to lock the shaft 83 of the actuator 82 in an up position so as to retain the support or bucking member 84 supporting that portion of the turntable 79S which is subjected to intense shock waves generated and directed along the horn or focusing device 55 into the die cavity. It is noted that if the locking devices 57 and 82L are eliminated, the respective lineal actuators 52 and 82 are preferably constructed to provide hydraulic shock absorption means for the reactive energy applied to the shafts 53 and 83 as a result of the shock waves generated.

The output of the receiving ultrasonic transducer 87T is applied as a variable electrical signal to a suitable microprocessor 97 which includes an analog-to-digital converter and computing or processing circuits for processing such digital signals and providing control signals on its outputs which are applied both to a driver 98 for an electronic display 99 and a further control 96 for providing electrical signals on its output for controlling the operation of the master controller through a control input 91. In other words, if the signals generated by the receiving transducer 87T indicate that suitably sized particles are produced in the cavity of the die containing material being processed as determined by the processing of such signals by microprocessor 97, the master controller 90, through which control input 91, may be activated to cause the described cycle to be repeated as initiated by withdrawal of the focusing horn 55 from the cavity of the die containing material which has been properly processed so that the next die may be driven into alignment with such horn for processing the material it contains. In other words, if the circuits in the microprocessor or controller 96 do not indicate that a desired quantity of particulate material has been properly processed or the quality of the processed material (eg-the size of crystals or diamonds produced) has not reached a desired or predetermined condition, then the master controller 90 may be operable to generate a suitable signal or signals on the output 92B for properly controlling the high voltage pulse control 50A to pulse the field coils 50C one or more additional times in order to attain the desired results in the material in the die being processed.

Notation 93 refers to a keyboard for generating signals, either from a memory or by selective operation of the keys thereof, which signals may be applied to one or more programming circuits of the master controller 90 to either change its mode of operation for experimental purposes or whenever a new material or formulation of particles is disposed in the cavities of the dies of the apparatus. In other words, input 91 to the master controller extends to suitable recording for programming circuits of the master controller which may comprise a so called PROM, a programmable read only memory or the like capable of generating desired pulse or code signals on its outputs for effecting the described automatic and/or adaptively controlled operation of the material processing apparatus previously described herein.

Other forms of the invention are noted as follows:

I. The rotating drum 16 of FIG. 1 and the turntable 76 of FIG. 6 may be replaced by an endless flight conveyor wherein the flights are heavy plates or blocks of metal, such as steel, hingedly joined to form an endless belt with each containing one or more cavities, recepticles or holding mean such as fixtures for holding die blocks such as dies 19 of FIGS. 1 and 6 and disposing same in alignment with filling, shock wave processing and removal means disposed along the conveyor for performing the functions described. A suitable heavy support at the shock wave processing station may be provided between the sections of the belt or endless flight array for supporting each flight thereof when it comes into alignment therewith and its die is engaged by the end of the shock wave transmitting horn or horns.

II. The support and conveyance for the die or dies may also comprise a metal structural member or assembly such as an elongated metal block adapted to be intermittently driven in a lineal path by a suitable motorized drive means controlled to dispose each of the die blocks held thereby in alignment with the respective filling, shock wave processing and removal means for the dies and/or processed materials.

III. In addition to applying shock waves to the materials disposed in the described dies, heat generated by induction, resistance heating means, plasma arc generating means or the intense radiation of a laser or electron gun may also be applied to the material or materials disposed in the dies before and/or after processing same with shock waves as described above. Such heating may be operable to prepare or fuse the paryiculate material for shock wave processing and to change its physical characteristics or structure prior to and/or after it has been subjected to the described shock wave treatment. Such heat generating means may be supported adjacent to or within the drum or table of FIGS. 1 and 6 or a flight conveyor as defined above.

IV. In a mode of operation of the hereinbefore described apparatus, the dies 19,19A, etc. may remain in place during the entire operation and removed only for periodic cleaning, repair or replacement. Removal of processed materials from the dies may be effected by one or more means disposed adjacent the drum, turntable, flight conveyor or block support of the type described which removal means may comprise (a) one or more powered rotating metal brushes which are driven into the cavities of the dies from above or adjacent the conveyour or support for the dies and physically engage and abrade, scour or otherwise remove processed mateial from the walls of the dies after which liquid or gas or a combination of both may be automatically flowed into the cavity of the die to flush the partciles and processed material from the mold or die. A high velocity jet or jects of liquid or gas may also be employed to blast or machine remove processed materials from the dies either while supported by the described supports and/or while removed therefrom at a die cleaning station.

V. The dies may be eliminated from the apparatus described and replaced by mere cavities in the drum 16, the turntable member 79, or the described flights or block mentioned above for supporting such dies wherein such cavities would be shaped to receive the shock wave directing tool and cooperate therewith in effecting compression of the particulate material to be processed. Cleaning and removal of material from the cavities may be effected as described above.

VI. Other means than the manipulators of FIGS. 1 and 6 may be employed to handle dies and materials to be processed. For example, special devices disposed adjacent the die support may be used to add and remove dies from their recepticles and vibrating conveying means may convey particulate as well as solid materials to the dies either before or after they are disposed on the drum, truntable or flight conveyor.

VII. Composite articles may be produced by means of the apparatus described above by one or more of the following processes and procedures:

1. A solid preformed member such as formed by casting, sintering, pressing, forging, machining from stock, impact extrusion or other means and made of metal, metals, cermets or other hard material or materials, may be disposed in each die prior to disposing particulate material thereagainst after which the particulate material and/or the solid material may be processed with one or more shock waves to (a) fuse the particulate material against the solid member, (b) weld the particluate material as a solid shape or coating against the solid member, (c) change the physical characteristics of both the solid and particulate materials, (d) form hard particles such as diamonds in the particulate material and bond said diamonds per se or in a matrix formed of the remaining portion of the particulate material to the solid member. In the latter process, the particulate material may comprise diamond forming carbon particles and one or more other particulate materials such as powdered metal of any suitable kind and/or carbides, nitrides, oxides, borides, silicides, dioxides of such metals as tungsten, titanium, aluminum, columbian, molybdenum, boron, etc.

2. A solid member as described above may first be placed in the dieto partly or completely fill the lower portion thereof and a mixtures of particles of hard and matrix materials may be disposed therein to become bonded or welded by fusion to the solid member. Particles of diamond, cubic boron nitride, borides, carbides, nitrides, oxides, etc. of such metals as titanium, tungsten, aluminum, molybdenum, etc. may be mixed with a matrix material such as metals, metal alloys, etc. of steel, and others of the above described metals to form a solid surfacing or layer on the solid member when subjected to shock wave treatment as described, on the upper surface of the solid member.

VIII. In the operation of the apparatus described above and illustrated in the drawings, each charge of particulate material disposed within a die cavity may be subjected to a single shock wave generated by the magnetic hammer arrangement described or to a plurality of shock waves of a predetermined number or as determined by signals generated by automatic scanning means of the type shown in FIGS. 6 and 7 which generates signals indicative of the internal structure of the material being processed preferably between each intermittently generated shockwave or group thereof applied to the material in the die. Such signals which are the result of modulating radiation passed through the material being processed may be digitized and analyzed in a microprocessor or computer and compared with signal recordings in a memory for providing control signals for controlling the generation of additional shock waves to predeterminately process the matter in the die in an adaptive control mode of operation. In other words, when the analysis of the signals generated from radiation passed through the material in the die indicate that a desired or predetermined condition in the internal structure of such material, such as the production of a certain number or diamonds of predetermined size, has been attained the generation of shock waves may be terminated. Such automatic analysis of radiation passed through the processing material may also be employed to control such process variables as frequency and intensity of shock waves generated, degree of auxilliary heating of the material being processed, etc. By generating a plurality of shock waves and directing them through carbon particles in a die, for example, larger than 0.10 carat diamonds may be produced in a process whereby diamonds are substantially grown in shock wave produced increments.

A radiation scanning technique as described above and utilizing transducing means for sensing radiation after it has passed through a solid or liquid material under processing together with the computer analysis of the transduced signals may be employed to adaptively control other processes such as molding, forging, crystal growing, casting, etc.

IX. In another form of the invention, shockwaves generated in a gas in a reaction chamber or in a shock tube may be directed against material of the types described which material is disposed in an open cavity exposed to the gas in which the shock waves are generated. Such apparatus and method may be provided in accordance with the disclosures found, for example, in copending application Ser. No. 93,779. By amplifying such shock waves in one or more of the manners disclosed in said copending application, extremely high energy shock waves may be generated in gases and employed to to heat and compress materials such as particulate carbon disposed in in one or more cavities made in suitable solid materials defining a die or dies of the types described herein and disposed against or forming a suitably supported platen or bucking member.

X. By generating and amplifying shock waves as described above and detailed in copending application Ser. No. 93,779 and directing such shock waves against particulate material which is disposed against or bonded to a surface, such as the materials disclosed elsewherein herein and in said copending application, such material may be heated and compressed to form a solid layer or coating on the surfaces of metal, ceramic or other materials such a tool steels and other tool forming materials as hard surfacing and hard coating materials employed for example, to improve the hardness, wear resistance and ablative resistence thereof as well as resistence to chemical attack, and heat corrosion resistance.

XI. Shock wave generating and material processing apparatus of the types described above and in copending application Ser. No. 93,779 may be employed to process materials other than those described herein, such as organic matter disposed in a chamber in which shock waves are generated by sparks or explosions of combustible gas or into which shock waves generated in one or more elongated shock tubes are directed as details in said copending application Ser. No. 93,779. Such organic matter as plant life such as alfalfa, green plant life and other matter containing cells from which it is desired to remove and separate the cell containing juices from may be disposed in a reaction chamber per se, carried therethrough on a conveyor, tumbled therein by rotating the chambr and carrying such materials to the top of the chamber from which the material is allowed to fall through the interior of the chamber, may be subjected to a plurality of shockwaves generated within or directed into such chamber, in such a manner that the cells of such matter become ruptured by the shock waves releasing the cell liquids which collect in the bottom of the chamber and may flow by gravity or be pumped from the chamber as the process continues or at intervals during the process when the shock waves are terminated. The solids and fibers remaining after the liquids have been removed from the matter so treated may be conveyed from the chamber either continuously or during periods the shock waves are not generated.

I claim:

1. An apparatus for applying shock waves to matter comprising:

first means for generating intense shock waves, second means in the form of a solid member operable for receiving and transmitting shock waves generated by said first means, said second means being operable to transmit shock waves generated by said first means in a given direction therethrough, third means for retaining a quantity of matter to be processed with energy transmitted thereto by means of said shock waves, fourth means for relatively moving said second means to bring a portion of said solid member to which said shock waves are transmitted from said first means into and out of engagement with matter supported by said third means which is to be processed with shock waves, fifth means for controlling the operation of said fourth means to cause said second means to compressively engage matter retained by said third means, means for controlling the operation of said first means in synchronization with the controlled relative movement of said second and third means so as to generate a shock wave upon the compressive engagement of said second means with matter retained by said third means, and sixth means for removing matter processed by said second means and transfering said processed matter from the vicinity of said second means, said sixth means and said second means for controlling the operation of said first means being controlled in their operation by said fifth means.

2. An apparatus in accordance with claim 1 including means for controlling relative movement between said second means and said third means in a manner to cause said second means to first predeterminately compress matter retained by said third means against said third means prior to the generation of a shock wave by said first means and to release its force against said matter after the generation of a shock wave and its application to said compressed matter.

3. An apparatus in accordance with claim 1 wherein said third means includes a heavy solid turntable and a plurality of dies containing cavities for holding respective quanities of matter to be compressed by said second means and operated on by shock waves generated by said first means and means for predeterminately positioning and holding said dies in predetermined assembly with said turntable.

4. An apparatus in accordance with claim 1 wherein said third means includes a drum and a plurality of dies predeterminately supported and located peripherally around said drum, each of said dies having an open cavity for holding a quantity of matter to be processed and accessible to and end of said second means to permit said second means to engage and compress matter disposed in said cavities of each of said dies when each cavity is aligned with said second means.

5. An apparatus in accordance with claim 1 including master control means for controlling the operation of said first, fourth and sixth means in an automatic cycle.

6. An apparatus in accordance with claim 1 wherein said third means includes a drum and a plurality of dies supported peripherally around said drum, each of said die means having an open cavity for holding said quantity of matter to be processed and accessible to the end of said second means.

7. An apparatus in accordance with claim 1 wherein said third means includes a rotary fixture and a plurality of die means secured to said rotary fixture and moveable therewith, and means for intermittently power rotating said fixture with respect to said second means to bring each of said die means respectively into alignment with said third means and respective quanities of matter retained thereby.

8. An apparatus in accordance with claim 7 wherein each of said die means is removably secured to said rotary fixture and means for periodically removing each die means from said fixture.

9. An apparatus in accordance with claim 7 including means for conveying each of said die means to said rotary fixture and for retaining each die means conveyed to said fixture at a fixed position on said fixture to permit said rotary fixture to preposition each die means in alignment with said second means.

10. An apparatus in accordance with claim 7 including means for conveying each of said die means to said rotary fixture and for retaining each die means conveyed to said fixture at a fixed position on said fixture to permit said rotary fixture to preposition each die means in alignment with said second means.

11. An apparatus for making artificial diamonds comprising a support means mounted for movement in a given direction, said support means having plural cavities arranged about a surface thereof, a plurality of die-blocks, means for transferring successive die blocks to said support means and to successively align said die blocks with said cavities and means for inserting said die blocks into said cavities, filling means for a particulate material, means for intermittently moving said support means to successively align said die blocks with said filling means and means for operating said filling means to dispose particulate material therefrom into a die block when said die block is aligned with said filling means, shock wave generating means for generating a shock wave adequate to convert the particulate material disposed in a die block into diamonds, means spaced from said filling means for moving said shock wave generating means into and out of engagement with die blocks supported by said support means and means for ejecting said die blocks successively from said support means.

12. Apparatus in accordance with claim 11 including means for applying controlled pressure to the particulate material disposed in a die block before the application of a shock wave thereto by said shock wave generating means.

13. Apparatus in accordance with claim 11 including means for automatically controlling the sequence of operating of said apparatus including the intermittent movement of said support, the transfer of die block to said support and their insertion in respective cavities of said support, the operation of said filling means, the movement of said shock wave generating means into and out of engagement with said die blocks and the successive ejection of said die blocks from said support means.

14. An apparatus in accordance with claim 11 wherein said support means is a rotary table mounted for rotation about a vertical axis and said die blocks are supported in cavities in the upper surface of said table.

15. An apparatus in accordance with claim 11 wherein said support means is a drum mounted for rotation about a horizontal axis and said die blocks are supported in a periferal surface of said drum.

16. An apparatus in accordance with claim 11 including a conveyor operable to receive said die blocks after they are ejected from said support means.

17. Apparatus in accordance with claim 11 including controls for automatically sequencially controlling movement of said support means and the operating of said filling means to sequentially dispose particulate material in each die block aligned with said filling means.

18. Apparatus in accordance with claim 17 wherein said filling means includes means for automatically dispensing a predetermined quantity of particulate material therefrom.

* * * * *